United States Patent

Miyakawa

[11] Patent Number: 6,051,150
[45] Date of Patent: Apr. 18, 2000

[54] PLASMA ETCHING METHOD AND METHOD OF MANUFACTURING LIQUID CRYSTAL DISPLAY PANEL

[75] Inventor: Takuya Miyakawa, Suwa, Japan

[73] Assignee: Seiko Epson Corporation, Tokyo, Japan

[21] Appl. No.: 08/689,258

[22] Filed: Aug. 5, 1996

[30] Foreign Application Priority Data

Aug. 7, 1995 [JP] Japan .................................. 7-219426

[51] Int. Cl.⁷ .................................................. C23F 1/10
[52] U.S. Cl. .................. 216/67; 216/75; 216/64
[58] Field of Search ............................ 156/643.1, 646.1; 216/23, 67, 63, 58, 64, 75, 77; 438/710

[56] References Cited

U.S. PATENT DOCUMENTS

| | | |
|---|---|---|
| 3,762,941 | 10/1973 | Hou . |
| 4,012,307 | 3/1977 | Phillips . |
| 4,430,547 | 2/1984 | Yoneda et al. . |
| 4,705,593 | 11/1987 | Haigh et al. .............................. 156/635 |
| 4,708,766 | 11/1987 | Hynecek .................................. 156/643 |
| 4,749,440 | 6/1988 | Blackwood et al. ..................... 156/646 |
| 4,857,382 | 8/1989 | Liu et al. . |
| 4,921,157 | 5/1990 | Dishon et al. . |
| 5,000,819 | 3/1991 | Pedder et al. . |
| 5,045,166 | 9/1991 | Bobbio . |
| 5,120,568 | 6/1992 | Schuurmans et al. . |
| 5,126,164 | 6/1992 | Okazaki et al. . |
| 5,147,520 | 9/1992 | Bobbio . |
| 5,178,682 | 1/1993 | Tsukamoto et al. . |
| 5,201,995 | 4/1993 | Reisman et al. . |
| 5,225,659 | 7/1993 | Kusano et al. . |
| 5,240,559 | 8/1993 | Ishida ..................................... 456/666 |
| 5,290,378 | 3/1994 | Kusano et al. . |
| 5,292,370 | 3/1994 | Tsai et al. . |
| 5,316,739 | 5/1994 | Yoshikawa et al. . |
| 5,340,618 | 8/1994 | Tanisaki et al. . |
| 5,368,685 | 11/1994 | Kumihashi et al. . |
| 5,384,167 | 1/1995 | Nishiwaki et al. ...................... 427/569 |
| 5,391,855 | 2/1995 | Tanisaki . |
| 5,399,830 | 3/1995 | Maruyama . |
| 5,407,121 | 4/1995 | Koopman et al. . |
| 5,449,432 | 9/1995 | Hanawa . |
| 5,499,754 | 3/1996 | Bobbio et al. . |
| 5,597,438 | 1/1997 | Grewal et al. . |
| 5,735,451 | 4/1998 | Mori et al. ............................... 228/206 |

FOREIGN PATENT DOCUMENTS

| | | |
|---|---|---|
| 371693 | 6/1990 | European Pat. Off. . |
| 1-125829 | 5/1963 | Japan . |
| 59-158525 | 9/1984 | Japan . |
| 61-127866 | 6/1986 | Japan . |
| 2-190489 | 7/1990 | Japan . |
| 2-281734 | 11/1990 | Japan . |
| 3-174972 | 7/1991 | Japan . |
| 3-219082 | 9/1991 | Japan . |
| 3-236475 | 10/1991 | Japan . |
| 4-186619 | 7/1992 | Japan . |
| 6-190269 | 12/1992 | Japan . |
| 5-82478 | 4/1993 | Japan . |
| 6-2149 | 1/1994 | Japan . |
| 60-1861 | 8/1995 | Japan . |

Primary Examiner—Terrel Morris
Assistant Examiner—Cheryl Juska
Attorney, Agent, or Firm—Stroock & Stroock & Lavan LLP

[57] ABSTRACT

An etching method includes the steps of supplying, to the gap between two powered electrodes, a gas capable of discharge which may be produced by adding water to helium and mixing a substance of chlorine, bromine or iodine or a compound containing chlorine, bromine or iodine; applying a RF voltage to the electrodes to produce gaseous discharge between the electrodes and the grounded stage having a material to be processed, thereon i.e., a glass substrate, at a pressure close to or at atmospheric pressure; and exposing the surface of the glass substrate to active species of the gas capable of discharge, which are produced by the discharge, to thus etch an ITO film on the surface of the substrate. The method is capable of removing a metal or a metallic compound containing a metal such as Au, Al, In, Sn or the like, which cannot be easily removed by conventional etching under atmospheric pressure, by producing a compound having a low boiling point or sublimation point and vaporizing it.

4 Claims, 6 Drawing Sheets

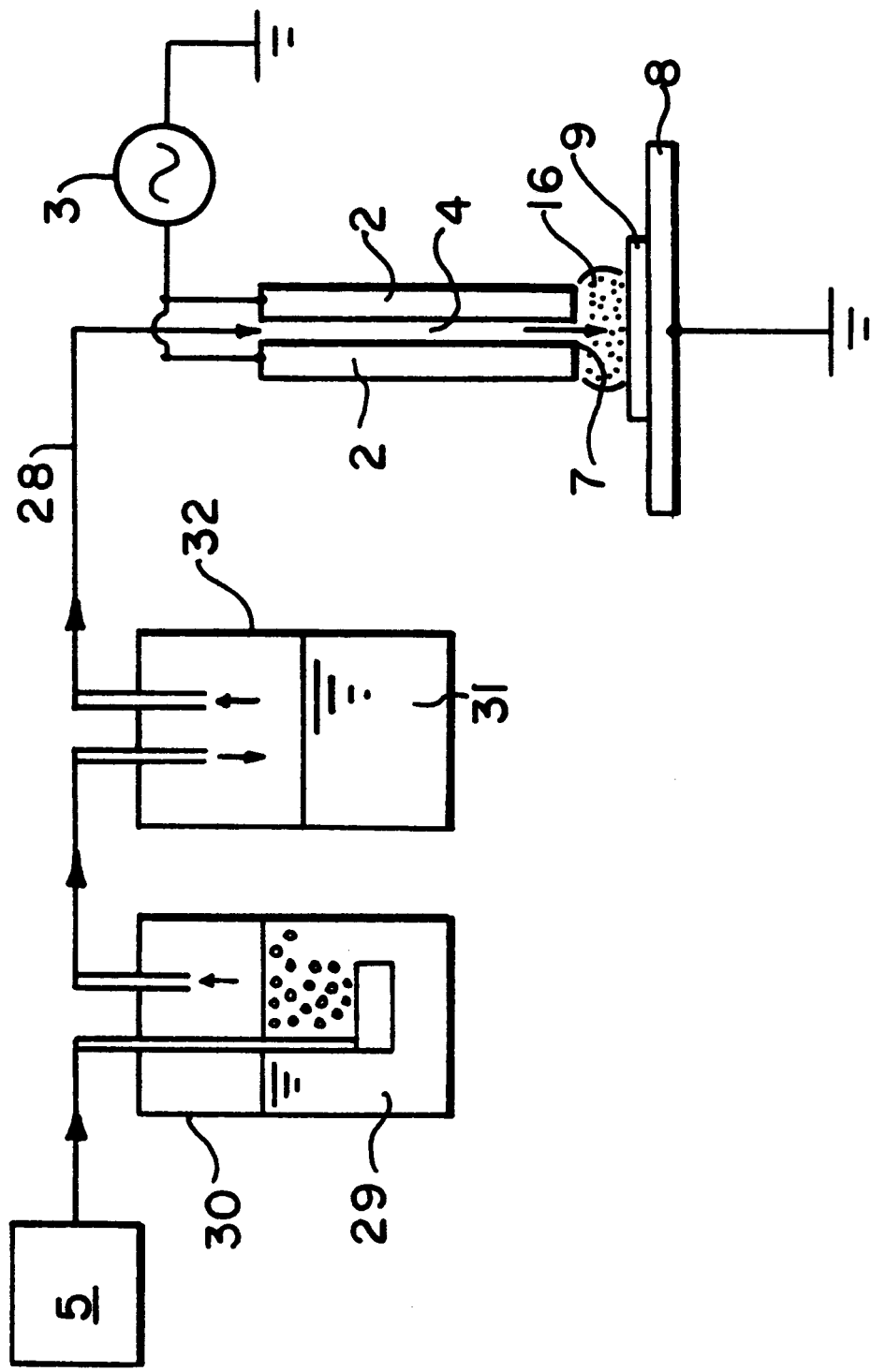

PLASMA ETCHING METHOD AND METHOD OF MANUFACTURING LIQUID CRYSTAL DISPLAY PANEL

BACKGROUND OF THE INVENTION

1. Field of the Invention

The present invention relates generally to a surface processing technique for removing, by etching, metals and inorganic substances from a surface of a substrate or other material to be processed and more particularly to a technique for forming transparent electrodes of an Indium Tin Oxide (ITO) film or wiring on a substrate used for fabrication of semiconductor devices, such as, for example, liquid crystal displays (LCD).

2. Description of the Related Art

Wet etching methods using an organic solvent and dry etching methods are well known as methods for removing oxides from surfaces of a substrate including a wafer, an IC chip and any other of various materials to be processed and typically used for fabrication of semiconductor devices. For example, when a desired electrode or wiring is formed on a glass substrate by etching an ITO (Indium Tin Oxide) film, which is widely used as a transparent conductive film in, for example, LCD, or when excessive ITO film is to be removed from a substrate, the wet etching method is generally used.

In recent years, however, increasingly fine etching has been required for complying with the demands for higher definition of a liquid crystal display device, and thus the dry etching method has increasingly become important. The dry etching method generally includes etching a surface of a material to be processed, such as a substrate, by using a plasma which is generated by gas discharge in a vacuum or at a reduced pressure. Additionally, an etching method has recently been developed in which plasma discharge is generated at a pressure close to or at atmospheric pressure, and therefore without the need for special equipment such as a vacuum chamber and a vacuum pump, thereby simplifying the surface treatment apparatus used and decreasing the size thereof. For example, Japanese Patent Laid-Open No. 2-15171 discloses a method in which a reactive gas mixture containing rare gas and organic monomer gas is introduced into a reactor, and a gas discharge plasma is generated at a pressure close to or at atmospheric pressure which is used to process a surface of a substrate. This reference also describes the plasma-etched surface obtained by the monomer gas and the other reaction conditions used.

The applicant of this application has also proposed a method disclosed in International Patent Application, Publication No. WO94/22628 in which an oxide ($SiO_2$) on a substrate surface is etched with active gas species, which are generated by gas discharge at a pressure close to or at atmospheric pressure. In this reference, a mixture containing a rare gas, compressed air or oxygen and a fluorine compound ($CF_4$, $C_2F_6$, $CF_6$, or the like) is used as a reactive gas mixture. Thus, in this method, for example, when a reactive gas mixture containing tetrafluorocarbon ($CF_4$) is used as a gas capable of discharge for removing an oxide film from a substrate, etching is carried out, as shown by the reaction Formula I below.

$$SiO_2 + CF_4 \rightarrow SiF_4(g) + CO_2(g) \qquad (I)$$

Thus, $SiO_2$ is fluorinated to $SiF_4$ which is easily removed by vaporization because of its relatively low boiling point (about 200° C.).

Conventional wet methods for etching an ITO film, as shown in the prior art, although satisfactory, suffer from the disadvantage that it is difficult to control a particular worked shape, and it is difficult to produce a uniform planer distribution of the etching solution, particularly, when the substrate has a large area to be processed. The wet method thus suffers from the disadvantage of causing nonuniformity in the degree of etching. The wet method also suffers from the disadvantage of treating and disposing the waste solution after etching, and thus the removed oxide in the waste solution may again adhere to the substrate. Particularly, in a TFT (Thin Film Transistor) type LCD, the wet method causes the problem that an Al (Aluminum) electrode and wiring provided below the ITO film to be removed may be corroded with the etching solution.

The conventional dry etching methods in a vacuum or under reduced pressure not only have a relatively high production cost and low throughput, but may also produce a toxic or harmful gas of an In (Indium) compound by chemical reaction, and additionally, has the possibility of thermal explosion due to the use of methanol. The dry etching methods are therefore also unsatisfactory.

On the other hand, the above-described plasma etching methods at a pressure close to or at atmospheric pressure suffer from the disadvantage that it is difficult to remove metals or metallic compounds containing metals such as gold (Au), indium (In), tin (Sn) and the like, whose fluoride products of the chemical reaction with the reactive gas mixture hardly vaporize. The plasma etching method thus cannot be employed efficiently for etching an ITO film which may be used as a transparent electrode film of a substrate in fabrication of LCD.

SUMMARY OF THE INVENTION

Generally speaking, in accordance with the present invention, a plasma etching method has been achieved in consideration of the above problems of the conventional wet and dry etching methods. There is thus provided a plasma etching method which includes generating gas discharge in a gas capable of discharge at a pressure close to or at atmospheric pressure, exposing a surface of a material or substrate to be processed to active species of the gas capable of discharge generated by the gas discharge, and etching the surface of the material or substrate to be processed. The gas capable of discharge preferably contains elemental chlorine, bromine or iodine, or a compound containing chlorine, bromine or iodine.

The selection of such a gas capable of discharge which contains chlorine, bromine or iodine permits conversion of a metal or metallic compound containing the metal such as Au, Al, In, Sn, or the like, which cannot be easily removed by plasma etching with a conventional fluorine compound at or about atmospheric pressure, into a compound which typically has a low boiling point or sublimation point, and which can thus be removed by vaporization.

In an exemplary embodiment, an iodine containing organic substance is mixed with the gas capable of discharge. Then, pure iodine gas may be generated by applying light or ultraviolet light to the organic iodine compound. Iodine with high purity can thus simply and safely be obtained and mixed with the gas capable of discharge.

The etching structure may include a heater heating the material to be processed or substrate to a predetermined temperature during the etching process. This further prevents re-adhesion of the removed metal compounds, formed by reaction with the active species generated by the gas plasma, to the surface of the material to be processed or substrate, and thus further improves the efficiency and rate of etching.

Elemental iodine or an iodine compound containing no reducing substance may be mixed with the gas capable of discharge and a reducing gas may be added to the gas capable of discharge to further increase the etching rate of an oxide and further improve productivity. An organic substance may be mixed with the gas capable of discharge. In this case, the addition of water to the gas capable of discharge improves the etching rate and further prevents the formation of a polymer film, formed from the organic substance, on the surface of a material to be processed and also on an electrode or the periphery thereof.

In another aspect of the present invention, there is provided a plasma etching method which includes generating gas discharge in a predetermined gas capable of discharge at a pressure close to or at atmospheric pressure, exposing the surface of a material to be processed to active species of the gas capable of discharge generated by the gas discharge, and etching the surface of the material or substrate to be processed, wherein the gas capable of discharge contains an organic substance selected so that an organometallic compound generated by the reaction with a substance on the surface of the material to be processed has a low boiling point and may thus be easily removed by vaporization.

The mixing of the thus-selected organic substance with the gas capable of discharge produces an organometallic compound having a low boiling point by reaction between the substance on the surface of the material to be processed, which is to be etched, and the active species of the gas capable of discharge, thereby facilitating removal of the organometallic compound. Further, the addition of water to the gas capable of discharge can prevent the formation of a polymer film from the selected organic substance used. Even if the polymer film is formed, the polymer is formed only on an electrode or the periphery of the material to be processed, thereby facilitating maintenance of the apparatus used by ashing.

In accordance with a further aspect of the present invention, there is provided a method of manufacturing a liquid crystal display panel by etching an ITO film formed on a substrate to form a desired transparent electrode or wiring which includes generating gas discharge in a predetermined gas capable of discharge containing elemental iodine or a compound containing iodine at a pressure close to or at atmospheric pressure, and exposing the surface of the substrate to active species of the gas capable of discharge, generated by the discharge, and etching the ITO film.

The method is capable of converting In and Sn contained in ITO into iodides having low boiling points or sublimation points, and easily removing the ITO by vaporization. Unlike a conventional dry etching method, the method of the present invention does not form a compound which may be toxic and/or explosive, and permits a safe and efficient process. During etching, heating the substrate can further prevent re-adhesion of the iodides generated by reaction with the active species and the substrate. Further, the addition of reducing gas to the gas capable of discharge can further improve the etching rate, as described above.

Accordingly, an object of the present invention is to provide an etching method which is easily capable of removing metals or metallic compounds containing metals such as Au, Al, In, Sn and the like, from a surface of a material to be processed, by using plasma activated species generated by gas discharge at a pressure close to or at atmospheric pressure.

Another object of the present invention is to provide a method of manufacturing a liquid crystal display panel which permits efficient, easy, safe, and fine etching of a transparent conductive film of ITO on a glass substrate by generating plasma discharge at a pressure close to or at atmospheric pressure, and which can thus comply with the demands for high definition and larger surface area of a liquid crystal display panel.

Still other objects and advantages of the invention will in part be obvious and will in part be apparent from the specifications and drawings.

The invention accordingly comprises the several steps and the relation of one or more of such steps with respect to each of the others, and the apparatus embodying features of construction, combinations of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 6 is a schematic drawing illustrating a system for supplying gas capable of discharge in an etching method in accordance with yet another embodiment of the present invention.

DESCRIPTION OF THE PREFERRED EMBODIMENTS

Figure 1:
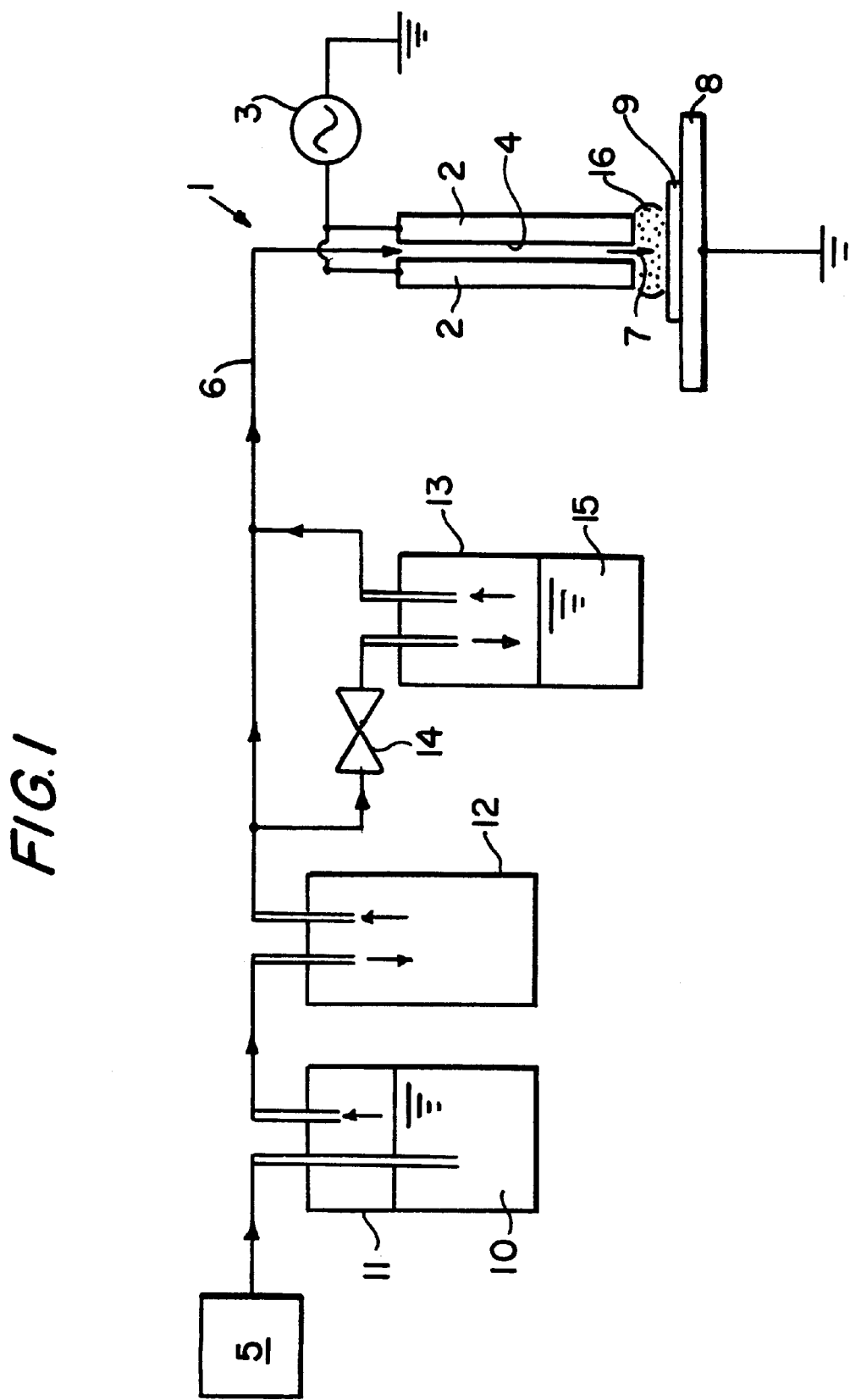
FIG. 1 is a schematic block diagram illustrating a surface processing apparatus constructed in accordance with a preferred embodiment for carrying out an etching method of the present invention.

FIG. 1 schematically shows one construction of a preferred surface processing apparatus suitable for carrying out the etching method of the present invention. Surface processing apparatus 1 is of a so-called "line type," and comprises a pair of electrodes 2 which may be vertically disposed opposite to each other with a predetermined space therebetween defining a gap 4, and which are connected to a radio-frequency power source 3. A gas capable of plasma discharge is supplied to an input end of gap 4 from a gas supply source 5 through a duct line 6. A linear gas nozzle 7 is formed at an exhaust end of gap 4. A stage 8 generally including an aluminum plate which may be grounded, is disposed directly below the exhaust ends of electrodes 2 with a slight clearance therebetween. A glass or other substrate 9, which may be used for a liquid crystal panel, may be placed on stage 8. Stage 8 can be moved perpendicularly to the lengthwise direction of gas nozzle 7 relative to electrodes 2 so that the entire surface of substrate 9 can easily be processed even if substrate 9 has a large surface area. In this embodiment, generally, an ITO film may be coated on the surface of substrate 9.

A tank 11 for storing pure water 10 and a tank 12 for removing excessive water from the gas capable of discharge sent from tank 11 are connected sequentially in the gas flow direction along duct line 6, generally in sequential order downstream from gas supply source 5. Duct line 6 downstream from tank 12 is branched to provide a bypass. The bypass is connected, through a valve 14, to a tank 13 for storing an iodide compound, for example, methylene iodide ($CH_2I_2$) 15.

In this embodiment, helium may typically be supplied as the gas capable of discharge from gas supply source 5, and water vapor is added to the helium gas by bubbling the helium gas through water 10 in tank 11. After excessive water is removed from the helium gas by condensation in tank 12, part of the helium gas is diverted by valve 14 and then sent into tank 13. After methylene iodide gas is added to the helium gas introduced into lank 13, this gas mixture is returned to duct line 6 to be mixed with helium gas sent directly from tank 12. The helium gas is then supplied to gap 4 between electrodes 2. The purpose of adding water to the gas capable of discharge in this embodiment is to prevent the formation of a polymer film on the surface of substrate 9 from methylene iodide, which is an organic substance. The addition of water also has the effect of accelerating etching.

The gas capable of discharge containing methylene iodide and water is supplied to gap 4, and ejected from gas nozzle 7 to replace the ambient atmosphere between the ends of electrodes 2 and substrate 9, and in the vicinity thereof, with the gas capable of discharge mixture. When a predetermined voltage is applied to electrodes 2 from power source 3, gas discharge occurs between electrodes 2 and grounded stage 8 and an atmospheric plasma formed. Active species of the gas capable of discharge are produced in a discharge region 16 by various reactions such as, for example, dissociation, ionization, excitation, etc. in the plasma. When the ITO film on substrate 9 is exposed to these active species, In and Sn are converted into iodides $InI_3$ and $SnI_4$, respectively, which have low boiling points, and are thus removed, as shown by the reaction Formulas II and III below.

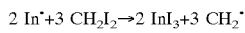
$$2\ In^{\cdot}+3\ CH_2I_2 \rightarrow 2\ InI_3+3\ CH_2^{\cdot} \quad \text{(II)}$$

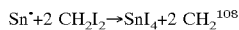
$$Sn^{\cdot}+2\ CH_2I_2 \rightarrow SnI_4+2\ CH_2^{108} \quad \text{(III)}$$

At this time, the reaction is further accelerated by the reducing atmosphere which is formed by CH-type radicals, thereby increasing the etching rate of the ITO film.

In this reaction, it is preferable to heat stage 8 or substrate 9 by using a heater or the like (not shown) to heat substrate 9 to a higher temperature in order to prevent re-adhesion of the iodides produced to substrate 9 in removal of the ITO film. Since tin iodide ($SnI_4$) has a sublimation point of 180° C., it is desirable, for securely preventing the re-adhesion, to heat substrate 9 to a temperature at least above the sublimation point of tin iodide. Since indium iodide ($InI_3$) has a boiling point of about 300° C., the re-adhesion is securely prevented by heating substrate 9 to a temperature above at least the boiling point of indium iodide. At the same time, the etching rate is also increased by heating substrate 9 in the above-described manner.

Figure 2A:
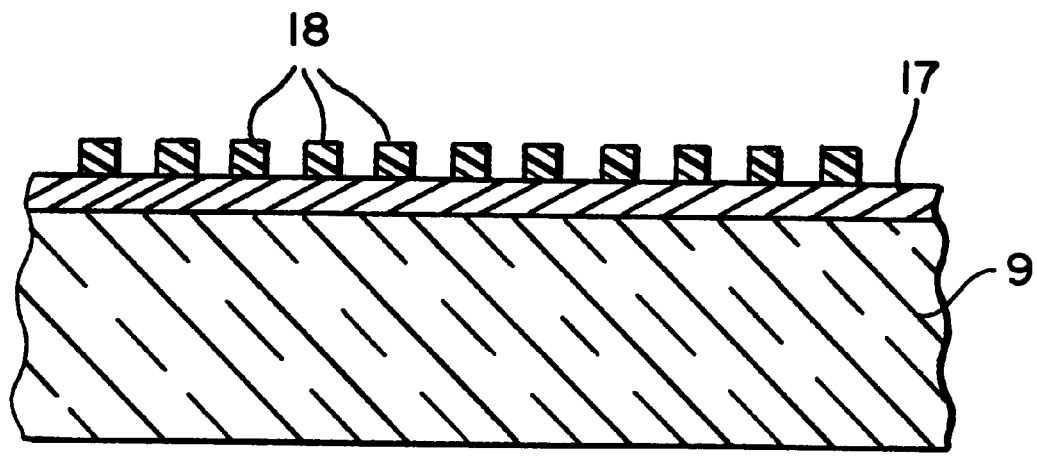
FIGS. 2A and 2B are schematic drawings illustrating a procedure for etching an ITO film on a surface of a liquid crystal cell in manufacturing a STN-type liquid crystal display panel in accordance with the invention.
Figure 2B:
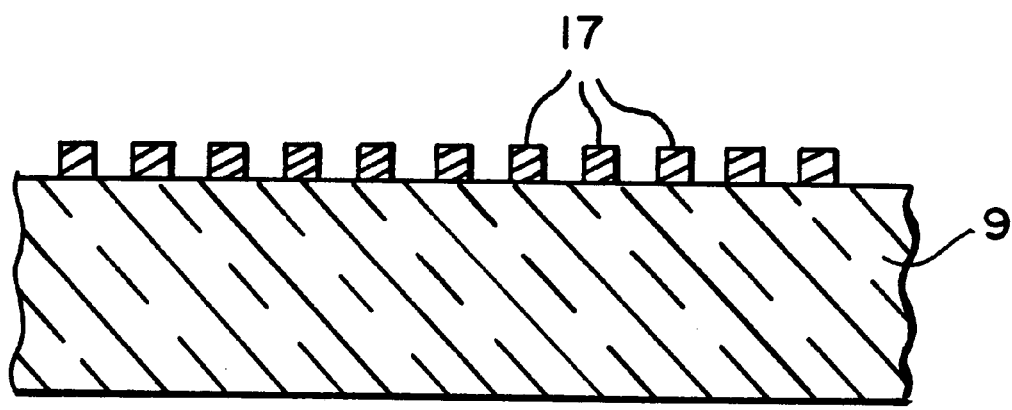

With reference to FIG. 2A, when substrate 9 is a glass substrate for forming an STN type LCD, a resist film 18 is formed in a predetermined pattern on an ITO film 17 formed on the upper surface of glass substrate 9. Glass substrate 9 is subjected to surface processing using, for example, methylene iodide as a gas capable of discharge, as described above, to etch ITO film 17. The resist film is then removed to obtain a desired patterned substrate as shown in FIG. 2B.

Figure 3A:
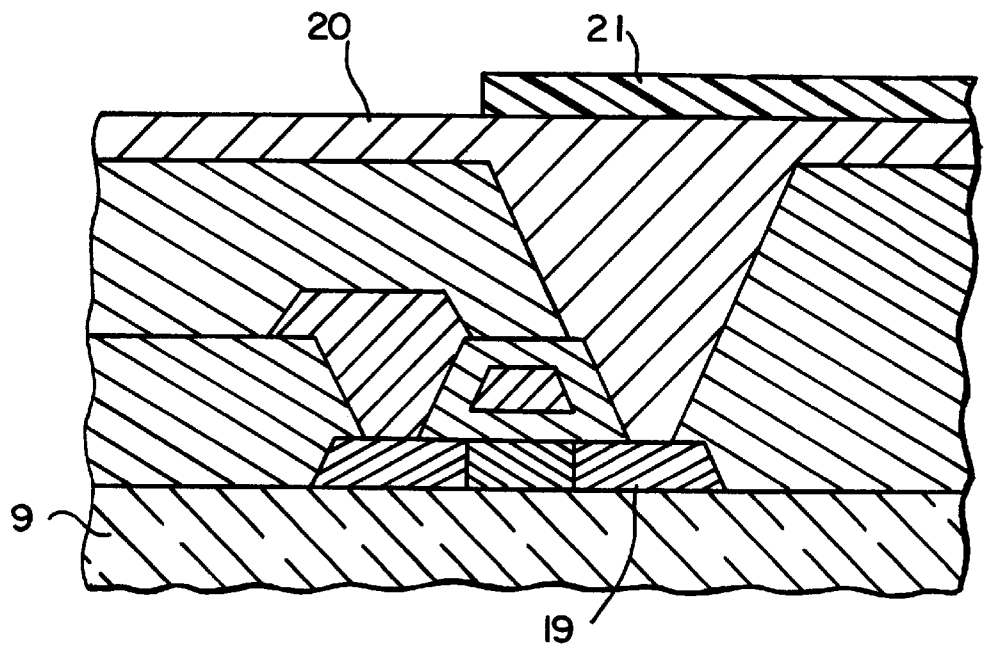
FIGS. 3A and 3B are schematic drawings illustrating a procedure for etching an ITO film on a surface of a liquid crystal cell in manufacturing a TFT-type liquid crystal display panel in accordance with the invention.
Figure 3B:
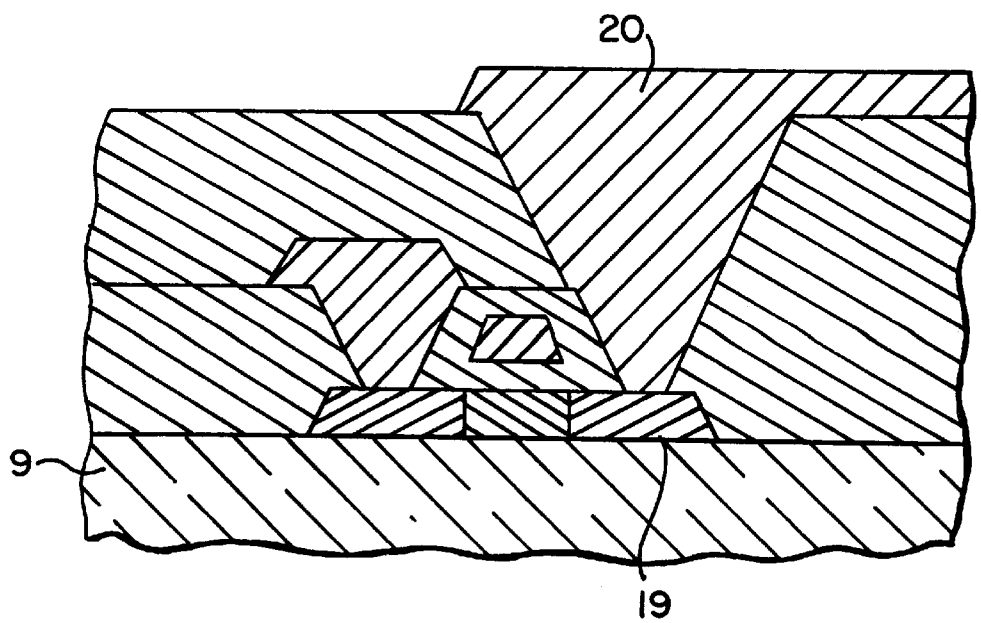

With reference to FIG. 3(A), when substrate 9 is a substrate for forming a TFT type LCD, a polycrystal silicon electrode 19 is formed on glass substrate 9. An ITO film 20 is formed so as to be connected to polycrystal silicon electrode 19, and a resist film 21 is formed in a predetermined pattern on ITO film 20. Glass substrate 9 is subjected to surface processing using, for example, methylene iodide as a gas capable of discharge in the same manner as described above. ITO film 21 is removed, as shown in FIG. 3(B), to obtain a desired array substrate.

Figure 4A:
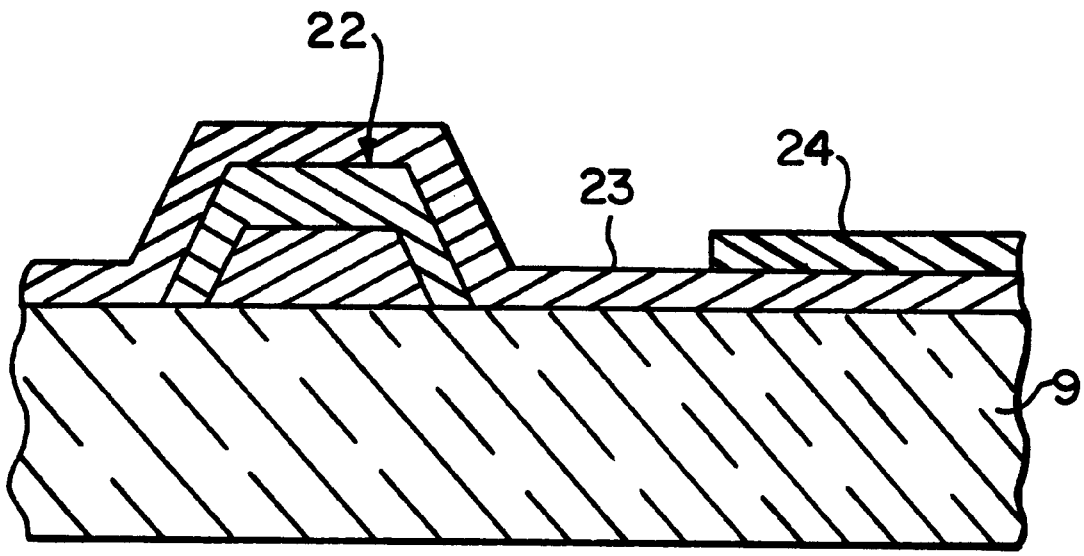
FIGS. 4A and 4B are schematic drawings illustrating a procedure for etching an ITO film on a surface of a liquid crystal cell in manufacturing a MIM-type liquid crystal display panel in accordance with the invention.
Figure 4B:
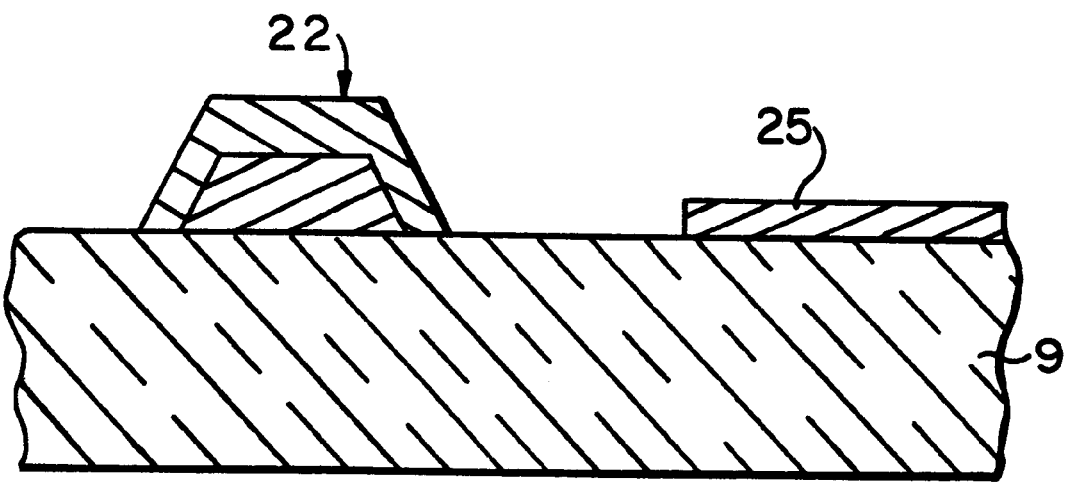

With reference to FIG. 4(A), when substrate 9 is a substrate for forming a MIM (Metal Insulator Metal) type LCD, an ITO film 23 is formed on glass substrate 9 on which MIM device 22 is formed. MIM device 22 is formed on glass substrate 9, and a resist film 24 is formed in a predetermined pattern on ITO film 23. Glass substrate 9 is subjected to surface processing with a plasma using methylene iodide as a gas capable of discharge at or about atmospheric pressure in the same manner as described above. Resist film 24 is removed to obtain a liquid crystal driving electrode 25 of ITO, as shown in FIG. 4(B).

In another embodiment, an iodine substance such as elemental iodine, aqueous iodine solution, an inorganic iodine compound such as ammonium iodide ($NH_4I$), hydriodic acid (HI) or the like; or an organic iodine compound such as methyl iodide ($CH_3I$), ethyl iodide ($CH_3CH_2I$) or the like, may be vaporized and used as the gas capable of discharge in place of methylene iodide. In this embodiment, desired etching can be performed in the same manner as described above. However, when an organic substrate is used, an organic polymer film may be easily formed on the surfaces of electrodes 2 and substrate 9, and in the vicinity thereof. Therefore, water may be added to the gas capable of discharge, as described above. When oxygen is added to the gas capable of discharge, it is possible to prevent polymerization of the organic substance, as described above, but the etching rate is decreased.

It is generally known that an organic iodine compound is dissociated to generate gaseous elemental iodine ($I_2$) by irradiation with light or ultraviolet rays. Methylene iodide, or another organic iodine compound, stored in tank 13, may be irradiated with light to generate iodine gas which can be mixed with the gas capable of discharge. In this case, iodine with higher purity can be safely and efficiently obtained.

It is also known that the etching rate of an oxide such as ITO is increased by surface processing with active species generated by plasma discharge in a reducing atmosphere, as described above. When an iodine substance, such as aqueous iodine solution or an iodine compound in which iodine does not combine with a reducing substance, is used in place of methylene iodide, the etching rate can be increased by adding hydrogen and an organic material to the gas capable of discharge or supplying them to the discharge region, thereby improving productivity.

Figure 5:
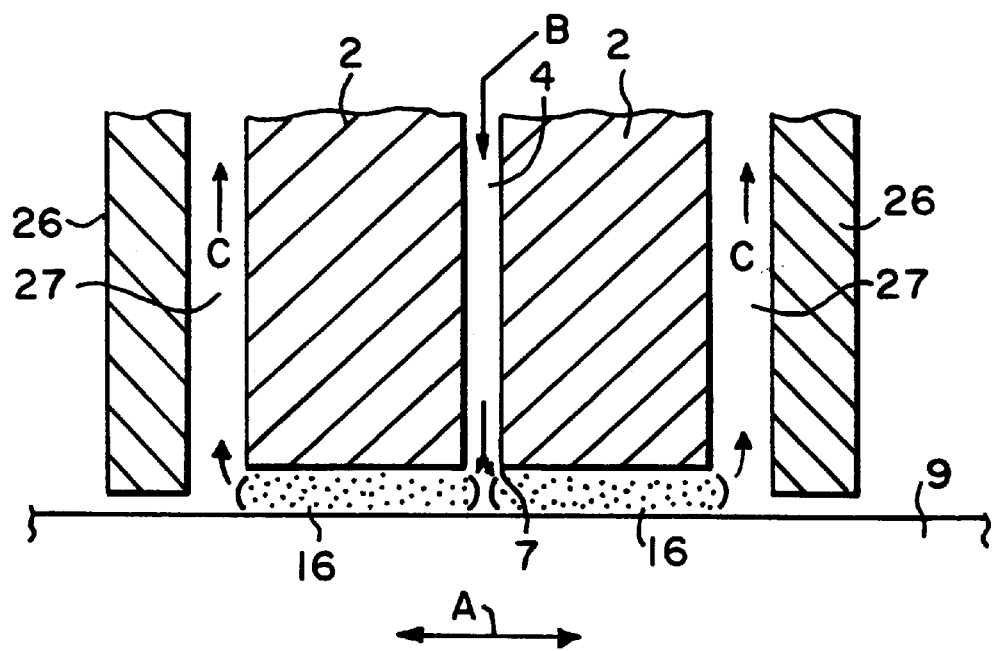
FIG. 5 is a partial enlarged view illustrating an electrode structure of a gas plasma device constructed in accordance with another embodiment of the invention.

Etching processing in accordance with the present invention more preferably uses a surface processing apparatus having an electrode structure as shown in FIG. 5 wherein like structures are indicated by like numerals. The primary difference between apparatus 1 and this embodiment is the formation of exhaust passages as now described. This electrode structure, like that of the embodiment shown in FIG. 1, also comprises a pair of electrodes 2 which are opposed to each other with predetermined gap 4 therebetween. Vertical partition walls 26 are disposed spaced from respective electrodes 2 along a direction A of movement of substrate 9, to respectively define upward exhaust passages 27 between partition walls 26 and electrodes 2. The gas capable of discharge supplied to discharge region 16 enters gap 4 in a direction of arrow B and exits through gas nozzle 7, is guided into exhaust passages 27, and exhausted in a direction without flowing out to the atmosphere from discharge region 16. Since partition walls 26 are provided so that the gap between the lower ends thereof and the surface of substrate 9 is smaller than the gap between the ends of electrodes 2 and the surface of substrate 9, air hardly enters discharge region 16 from the outside.

Because exhaust passages 27 are integrally provided in the electrode structure, as described above, it is possible not only to reduce the size of the whole apparatus but also to effectively prevent the iodides formed by reactions of ITO and ozone or active species, which are produced by gas discharge, from being released into the atmosphere. Particularly, when an aqueous iodine solution is used in place of methylene iodide 15 contained in tank 13, exhaust passages 27 are advantageous because of the need for exhaust of the gas capable of discharge. This embodiment can improve the safety of discharge by preventing mixing of air in discharge region 16, and thus enables uniform and safe etching.

FIG. 6 schematically shows the structure of a surface processing apparatus suitable for use in an etching method in another embodiment of the present invention. In FIG. 6, like components as those in the surface processing apparatus shown in FIG. 1 are denoted by like reference numerals. In this embodiment, the surface processing apparatus has substantially the same structure as the surface processing apparatus shown in FIG. 1 except that a tank 30 for storing pure water 29 and a tank 32 for storing a liquid organic substance 31 are connected sequentially to a duct line 28 in the downstream direction from gas supply source 5 for supplying the gas capable of discharge to electrodes 2 from gas supply source 5. After water is added to helium gas sent from gas supply source 5 by bubbling in tank 30, a gas of the organic substrate 31 is mixed with the helium gas in tank 32. The gas capable of discharge is then supplied to gap 4 between electrodes 2 and ejected into the clearance between the ends of both electrodes 2 and substrate 9 from gas nozzle 7. The purpose of adding water to the gas capable of discharge in tank 30 is to prevent the formation of a polymer film on the surface of substrate 9 from organic substance 31. At the same time, the addition of water promotes etching.

When a predetermined voltage is applied to electrodes 2 from power source 3, gas discharge is generated between substrate 9 and electrodes 2 so that the ITO film on substrate 9 is exposed to active species of the gas capable of discharge produced by the plasma. This embodiment typically uses methanol ($CH_3OH$) as organic substance 31. In and Sn of ITO are converted into trimethylindium ($In(CH_3)_3$) and tetramethyltin ($Sn(CH_3)_4$), respectively, and removed, as shown by the following reaction Formulas IV and V:

$$In^{\cdot}+3\ CH_3OH \rightarrow 3\ In(CH_3)_3+3\ OH^{-} \qquad (IV)$$

$$Sn^{\cdot}+4\ CH_3OH \rightarrow Sn(CH_3)_4+4\ OH^{-} \qquad (V)$$

Various organic substances including aromatic substances other than methanol can be used as organic substance 31 to be mixed with the gas capable of discharge, as long as the organic substances react with In or Sn to form organometallic compounds having relatively low boiling points or sublimation points. It is also generally advantageous to heat substrate 9 by using a heater or the like because it is thus possible to securely prevent re-adhesion of trimethylindium or tetramethyltin to substrate 9 and to increase the etching rate, as is the case in the embodiment shown in FIG. 1.

Although an example of conventional methods uses methanol in dry etching under vacuum or reduced pressure, as in this embodiment, an organic polymer film is formed over the interior of the vacuum chamber and must thus be frequently removed, thereby causing difficulties in maintenance of the apparatus. Although this embodiment easily produces polymerization at the same time as etching because the organic substance is used, it is possible to prevent the formation of an organic polymer film by adding water to or mixing oxygen with the gas capable of discharge, as described above, or by maintaining the content of the organic substance in the gas capable of discharge at a relatively low level. In this embodiment, since discharge is produced at a pressure close to or at atmospheric pressure, even if the organic polymer film is formed, the film is formed only on the surfaces of the electrodes and the material to be processed or in the vicinity thereof, not over the whole apparatus. Thus, the types of gases contained in the gas capable of discharge can be thereafter changed so that the film can easily be removed by ashing, thereby significantly facilitating maintenance of the apparatus, as compared with conventional etching methods.

The present invention is also capable of removing Au and Al, which cannot be etched by conventional plasma discharge using as the gas capable of discharge a fluorine compound such as $CF_4$ at or about atmospheric pressure, by using as the gas capable of discharge an iodine substance or an iodide in the same manner described with respect to In and Sn. For example, an Au film formed on a substrate can easily be etched by producing a low-boiling point compound such as $AuI_3$ or the like from active species of iodine generated by gas discharge.

In a further embodiment of the present invention, a chlorine or bromine substance or a compound containing chlorine or bromine can be used as the gas capable of discharge for etching Al. For example, Al wiring formed on a substrate can easily be etched by producing a low-boiling point compound such as $AlCl_3$ from plasma active species of chlorine.

An ITO film formed on a surface of a substrate for high-definition TFT type LCD was etched by using the surface processing apparatus shown in FIG. 1 under the following conditions:

Working power: 200 W

Gas used: mixture of helium and $CH_2I_2$

Gas flow rate: helium 20 l/min $CH_2I_2$ 3 l/min

Amount of water: 20 l/min (supplied to the tank 11)

As a result, the ITO film may be completely removed from the substrate within a processing time of 10 minutes. However, an organic polymer film was formed on the ITO film when the amount of $CH_2I_2$ in the gas capable of discharge was increased, or when the amount of water was decreased.

The present invention constructed as described above has the following properties:

In the plasma etching method of the present invention, a substance of chlorine, bromine or iodine, or a compound containing chlorine, bromine or iodine is mixed with the gas capable of discharge so as to easily etch a metal such as Au, Al, In, Sn or the like or a metallic compound containing such metal, which ordinarily cannot be easily removed by a conventional etching method at or about atmospheric pressure. The present invention can thus provide an etching method with high general-purpose properties. The present invention can also remove the drawbacks of a conventional wet or dry etching method, improve processing precision and significantly improve throughput, thereby improving productivity.

The plasma etching method of the present invention may also use as the gas capable of discharge, an organic substance which produces an organometallic compound having a low boiling point by reaction of a substance of a material surface to be etched and active species of the gas capable of discharge, and is thus capable of easily removing In, Sn or the like which cannot be easily removed by a conventional method.

The method of manufacturing a liquid crystal display panel of the present invention uses as the gas capable of discharge iodine or a compound containing iodine so that a transparent conductive film comprising ITO formed on the glass substrate can easily be etched by plasma discharge generated at a pressure close to or at atmospheric pressure. It is thus possible to increase the precision of fine processing of wiring and electrodes, and thus comply with the demand for increased definition and the size of a liquid crystal display panel. The method of the present invention also enables easy control and uniform processing, and can thus improve throughput and attempt to decrease production cost. Further, the processing work can more safely be carried out.

It will thus be seen that the objects set forth above, and those made apparent from the preceding description, are efficiently attained and, since certain changes may be made in the above construction without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall there between.

What is claimed is:

1. A plasma etching method comprising the steps of:

providing a material to be processed, having a surface thereof;

mixing helium with an organic material which is reactive with Au, Al, In or Sn to form organometallic compounds;

mixing chlorine, bromine or iodine or a compound containing chlorine, bromine, or iodine with the helium mixture;

generating gas discharge in said helium mixture at a pressure close to or at atmospheric pressure thereby producing active species;

exposing said surface of said material to be processed to said active species; and forming said organometallic compound by reacting the active species with the material to be processed and etching said surface of the material to be processed by removing the organometallic compound.

2. The plasma etching method according to claim 1, further comprising the step of adding water vapor to said helium mixture prior to the step of generating gas discharge.

3. The plasma etching method of claim 1, wherein the organic material is selected so that a compound produced by a reaction between said organic material and said surface of the material to be processed has a lower boiling point than the boiling point of the material to be processed.

4. The plasma etching method of claim 3, comprising the step of adding water vapor to said helium mixture prior to the step of generating gas discharge.

* * * * *